United States Patent
Taylor et al.

(10) Patent No.: US 7,589,520 B2
(45) Date of Patent: Sep. 15, 2009

(54) SOAK PROFILING

(75) Inventors: Troy Taylor, Ramona, CA (US);
Michael Callaway, La Mesa, CA (US);
Tom Jones, Escondido, CA (US)

(73) Assignee: Delta Design, Inc., Poway, CA (US)

( * ) Notice: Subject to any disclaimer, the term of this patent is extended or adjusted under 35 U.S.C. 154(b) by 0 days.

(21) Appl. No.: 11/633,543

(22) Filed: Dec. 5, 2006

(65) Prior Publication Data

US 2008/0129322 A1 Jun. 5, 2008

(51) Int. Cl.
*G01R 31/28* (2006.01)
(52) U.S. Cl. .................................................. 324/158.1
(58) Field of Classification Search ........................ None
See application file for complete search history.

(56) References Cited

U.S. PATENT DOCUMENTS

| | | | |
|---|---|---|---|
| 5,205,132 A | 4/1993 | Fu | |
| 5,788,084 A * | 8/1998 | Onishi et al. | 324/158.1 |
| 5,844,208 A | 12/1998 | Tustaniwskyj et al. | |
| 5,977,785 A | 11/1999 | Burward-Hoy | |
| 6,257,319 B1 * | 7/2001 | Kainuma et al. | 324/760 |
| 6,389,225 B1 | 5/2002 | Malinoski et al. | |
| 6,476,627 B1 | 11/2002 | Pelissier et al. | |
| 6,489,793 B2 | 12/2002 | Jones et al. | |
| 6,518,782 B1 | 2/2003 | Turner | |
| 6,593,761 B1 * | 7/2003 | Fukasawa et al. | 324/754 |
| 6,628,132 B2 * | 9/2003 | Pfahnl et al. | 324/760 |
| 6,650,132 B2 | 11/2003 | Pelissier | |
| 6,728,653 B1 | 4/2004 | Figueredo | |
| 6,788,084 B2 | 9/2004 | Jones et al. | |
| 6,794,620 B1 | 9/2004 | Touzelbaev | |
| 6,825,681 B2 | 11/2004 | Feder et al. | |
| 6,829,554 B2 | 12/2004 | Dueregger et al. | |
| 6,844,752 B1 | 1/2005 | Cascella | |
| 6,980,016 B2 | 12/2005 | Pullen et al. | |
| 6,985,000 B2 | 1/2006 | Feder et al. | |
| 7,173,451 B2 * | 2/2007 | Kanno et al. | 326/38 |
| 2002/0109518 A1 * | 8/2002 | Saito et al. | 324/760 |
| 2005/0012498 A1 * | 1/2005 | Lee et al. | 324/158.1 |
| 2007/0236235 A1 * | 10/2007 | Kang et al. | 324/760 |
| 2008/0042667 A1 * | 2/2008 | Yamashita et al. | 324/754 |

* cited by examiner

*Primary Examiner*—Jermele M Hollington
(74) *Attorney, Agent, or Firm*—Foley & Lardner LLP

(57) ABSTRACT

A method for soaking a device in an automated testing system, includes setting a temperature control device to a first temperature, exposing the device to the temperature control device, and driving the temperature control device to a second temperature. The temperature transition rate from the first temperature to the second temperature is derived from a first natural decay rate. The first natural decay rate is based on a first-order thermal response of the device when the device is suspended in free air. The second temperature of the temperature control device is relative to a set point temperature so that when the device is socketed for testing, the temperature of the device settles at the set point temperature.

13 Claims, 6 Drawing Sheets

SOAK PROFILING

FIELD OF INVENTION

The present invention generally relates to a system and method for controlling the temperature of a device such as a semiconductor device. Specifically, the present invention relates to a system and method for decreasing the time required to "soak" or stabilize and maintain the temperature of a semiconductor device prior to the testing of the semiconductor device.

BACKGROUND OF THE INVENTION

The following description of the background of the invention is provided simply as an aid in understanding the invention and is not admitted to describe or constitute prior art to the invention.

The present invention relates generally to the field of automated testing of semiconductor devices. Specifically, the present invention relates to a system and method for controlling the temperature of semiconductor devices in an automated testing handler.

Control of DUT ("device under test") temperature in testing operations has been practiced for some time. For example, U.S. Pat. No. 5,297,621 discloses a liquid bath in which devices are immersed during testing. The liquid in the bath is inert and comprises a mixture of two liquids having boiling points above and below the desired temperature. By varying the mixture of the two liquids, the liquid in the bath is arranged to have a boiling point which is at the desired operating temperature of the DUT ("set point temperature"). Heat generated by the DUT is dissipated by convection within the bath and by nucleate boiling of the liquid on the DUT. Heat transfer from the DUT to the liquid is facilitated by placing a heat sink in contact with the DUT.

Soaking refers to the process of taking a device under test (DUT) from an ambient temperature (typically 17-23° C.) to a test set point temperature (typically between −55° C. and 150° C.). The purpose of soaking is to bring each DUT to a set point temperature and stabilize the DUT's temperature at the set point temperature as quickly as possible prior to the start of test (SOT) of the DUT such that the DUT is at a stable temperature within a guard band of the set point temperature.

FIG. 1 illustrates time vs. temperature readings for a step-wise soaking method. The time, in seconds, is displayed on the X axis in two (2) second increments. The measurement of temperature for a heater for heating the DUT and the temperature of the DUT is represented along the Y axis. As shown in FIG. 1, the total soak time of a DUT in the system begins when a DUT is picked up by a chuck of the automated testing handler. At 0 seconds, a DUT is picked up by the chuck of the automated testing handler. A heater is activated or is active at time zero. The temperature of the heater increases until the temperature of the heater has reached an overdrive (OD) temperature in a guard band range of temperatures. The guard band temperature range is user configurable and is a range around the desired set point. For example, as shown in FIG. 1, if the soak temperature is 100° C. with a guard band of +/−5° C., the range would be from 95°-105° C. Overdrive temperatures are typically 3-15° C. above the set point temperature, but are very dependent on the set point temperature itself, the physical construction of the device, and the quality of the thermal interface between the device and the chuck. It should also be noted that for cold set points (below ambient), the overdrive temp would be below the set point. The period of time the heater enters and remains at the OD temperature in the guard band is known as the OD time. Next, as shown in FIG. 1, at an "index time" the DUT having an ambient temperature is socketed. After socketing, the DUT is heated by the heater which is driving toward an OD temperature.

As shown in FIG. 1, once the heater reaches a temperature in the OD temperature band a period of time referred to as "OD time" begins. During OD time, the temperature of the heater and the socketed device is driven higher than a temperature at which the DUT is to be tested. Next, at a specific time triggered by the automated testing handler, the temperature of the heater decreases to that of a hold temperature. The hold temperature is in a hold temperature guard band where the temperature is generally very close to, if not at the set point temperature. So for a 110 set point, the hold temperature could be 110 or slightly higher to account for temperature loss to ambient. Note that for cold set points, the hold temperature would be (most likely) below the set point.

As shown in FIG. 1, the period of time the heater enters and remains in the hold temperature guard band is referred to as the hold time. Accordingly, the temperature of the DUT decreases. As shown in FIG. 1, at the end of a predetermined period of time, the temperature of the DUT falls within the hold temp guard band at the hold temperature. The hold temperature is also the test temperature and at this predetermined period of time, the automated testing handler begins testing the DUT. In the alternative, at the expiration of the hold time, if the hold temperature of the DUT does not equal the predetermined test temperature, the automated testing handler causes the heater to transition to the test set point temperature which in turn drives the DUT temperature to the predetermined test temperature.

One drawback to the step-wise soaking method illustrated in FIG. 1 is that in order to stabilize a DUT at the test set point temperature, the temperature of the DUT must initially be driven beyond the set point temperature so that the temperature of the DUT will settle back to the test set point temperature. Ideally, an optimum soak method would drive the temperature of a DUT directly to the set point guard band without the need to first raise the temperature above the set point.

In another system for soaking DUTs, the actual temperature of the DUT is used as feedback information to control the soak method. In order to obtain the actual temperature of the DUT, the DUT is provided with a temperature sensor. For example, an internal thermal diode or resistance temperature detector (RTD) may be mounted onto a DUT. The purpose of the internal thermal diode and RTD is to provide the automated handling system with instantaneous information related to the temperature of the DUT during the soak process. This direct temperature feedback (DTF) method is illustrated in FIG. 2. FIG. 2 shows plots of time vs. temperature for a heater controlled by the automated testing handler and the temperature of the DUT. As shown, the DTF method reduces the total soak time to less than three (3) seconds. At 0 seconds the DUT is picked up by a chuck. Immediately after time=0, the heater, based on temperature feedback information provided by the DUT's temperature sensor drives the DUT temperature directly to a set point temperature. Accordingly, at less than three (3) seconds the DUT is ready to be tested by the automated testing handler.

Unfortunately, in normal production, it is not feasible to electrically connect a temperature sensor to a DUT while the DUT is being transported around in the handler. Thus, a soak method that approximates the DTF method is desired for practical use. It is thus an object of the present invention to provide a method and apparatus which allows accurate and efficient temperature control of devices during soaking.

SUMMARY OF THE INVENTION

According to one embodiment of the invention, a method for soaking a device in an automated testing system, includes setting a temperature control device to a first temperature, exposing the device to the temperature control device, and driving the temperature control device to a second temperature. The temperature transition rate from the first temperature to the second temperature is derived from a first natural decay rate. The device is then socketed in preparation for testing.

According to yet another embodiment of the invention, the first natural decay rate is based on a first-order thermal response of the device when the device is suspended in free air.

According to another embodiment of the invention, the second temperature of the temperature control device is relative to a set point temperature so that when the device is socketed the temperature of the device settles at the set point temperature.

According to still another embodiment of the invention, a method for soaking a device in an automated testing system includes the step of driving the temperature control device to a third temperature, wherein a temperature transition rate to the third temperature is derived from a second natural decay rate. The second natural decay rate is based on a second-order thermal response of the device losing heat to a contactor.

According to another embodiment of the invention, an automated testing system for soaking a device includes a carrier for housing one or more devices to be tested, a contactor for connecting the devices to a testing apparatus, a pick and place handler for transporting the devices in the automated testing handler, a temperature control device connected to the pick and place handler for modifying the temperature of the devices and a controller for driving the temperature of the temperature control device. The temperature transition rate of the driven temperature control device is derived from a first natural decay rate.

It is to be understood that both the foregoing general description and the following detailed description are exemplary and explanatory only, and are not restrictive of the invention as claimed. These and other features, aspects and advantages of the present invention will become apparent from the following description, appended claims, and the accompanying exemplary embodiments shown in the drawings, which are briefly described below.

DETAILED DESCRIPTION

Embodiments of the present invention will be described below with reference to the accompanying drawings. It should be understood that the following description is intended to describe exemplary embodiments of the invention, and not to limit the invention.

Figure 3:
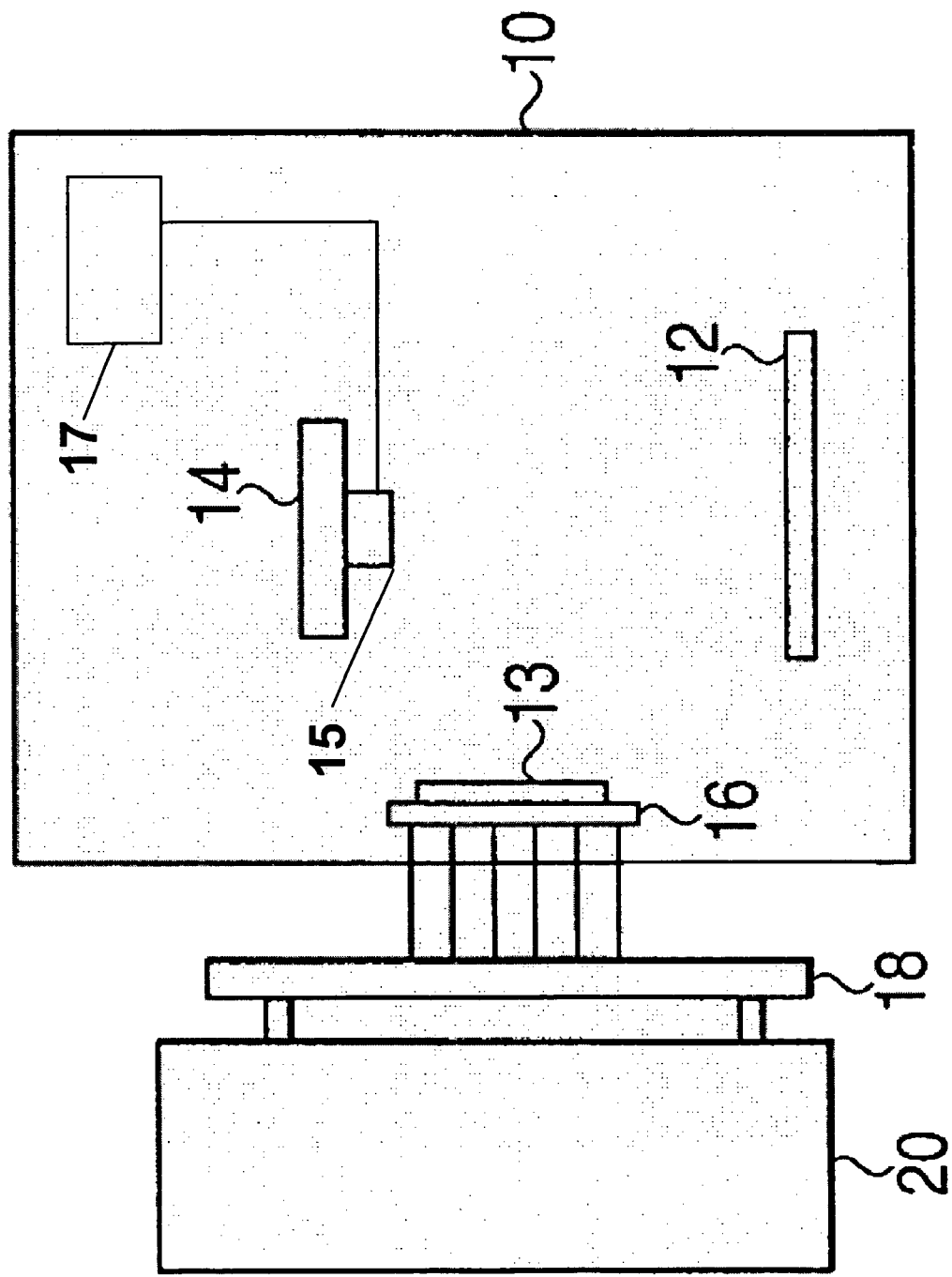
FIG. 3 is an automated testing handler incorporating the present invention.

A typical test environment for a DUT 13 is shown in FIG. 3. An automated testing handler 10 is provided. A tray or other carrier 12 containing several IC devices to be tested 13 is loaded into the automated testing handler 10. Individual devices 13 are removed from the tray by a pick and place handler 14 having a chuck and loaded onto a contactor 16 which contacts a load board 18 for interfacing with a test head 20 which forms part of a high-speed tester such as the ITS 9000GX tester available from Schlumberger Technologies, Inc. of San Jose, Calif. The handler 14 includes a temperature control device (heater 15) that is driven by a controller 17 and remains in contact with the DUT 13 until the test is complete. After testing, the DUT 13 is then returned to the carrier 12 and another DUT 13 is selected and tested.

Figure 1:
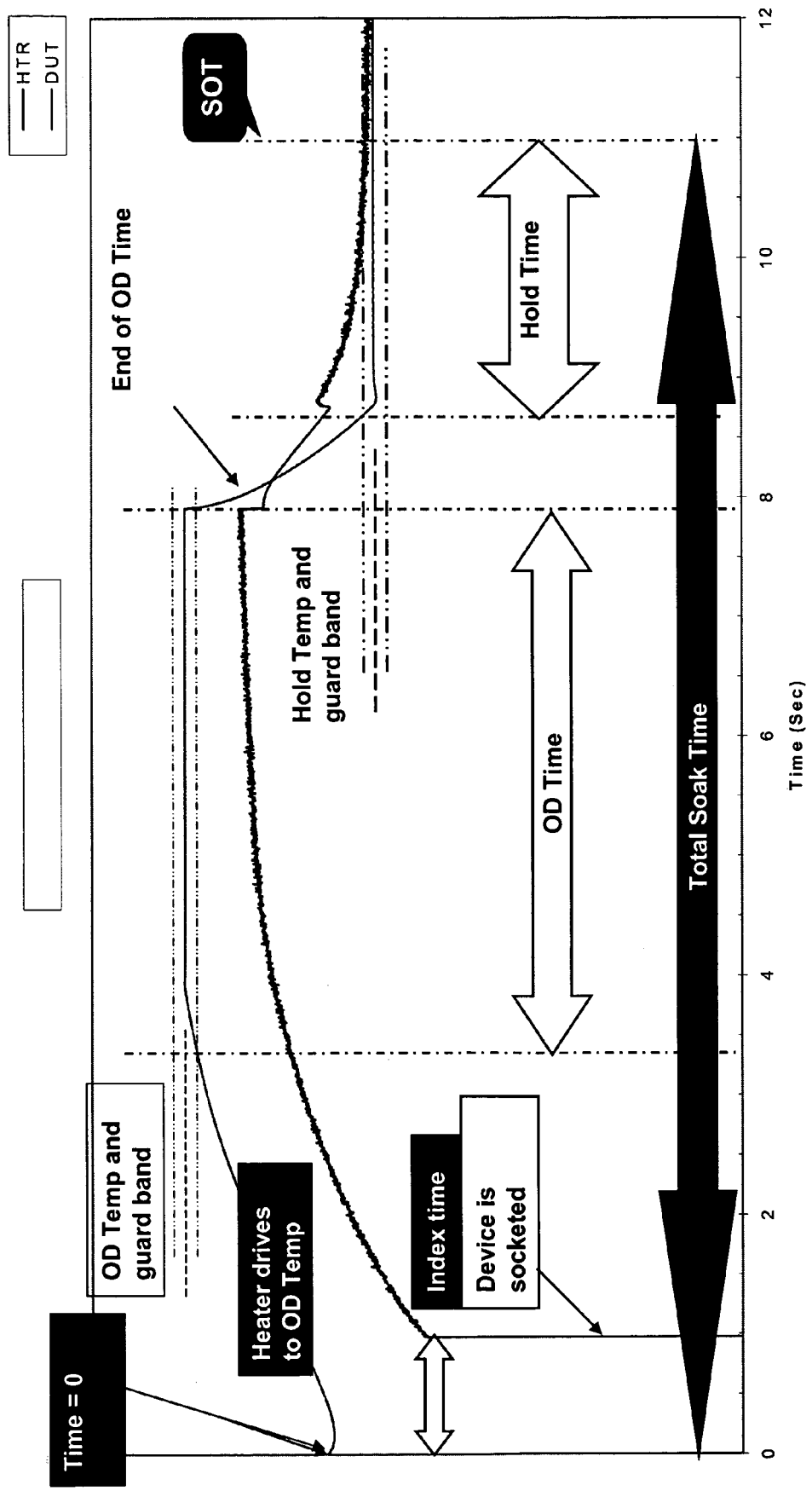
FIG. 1 is a graph illustrating a step-wise soaking method.
Figure 2:
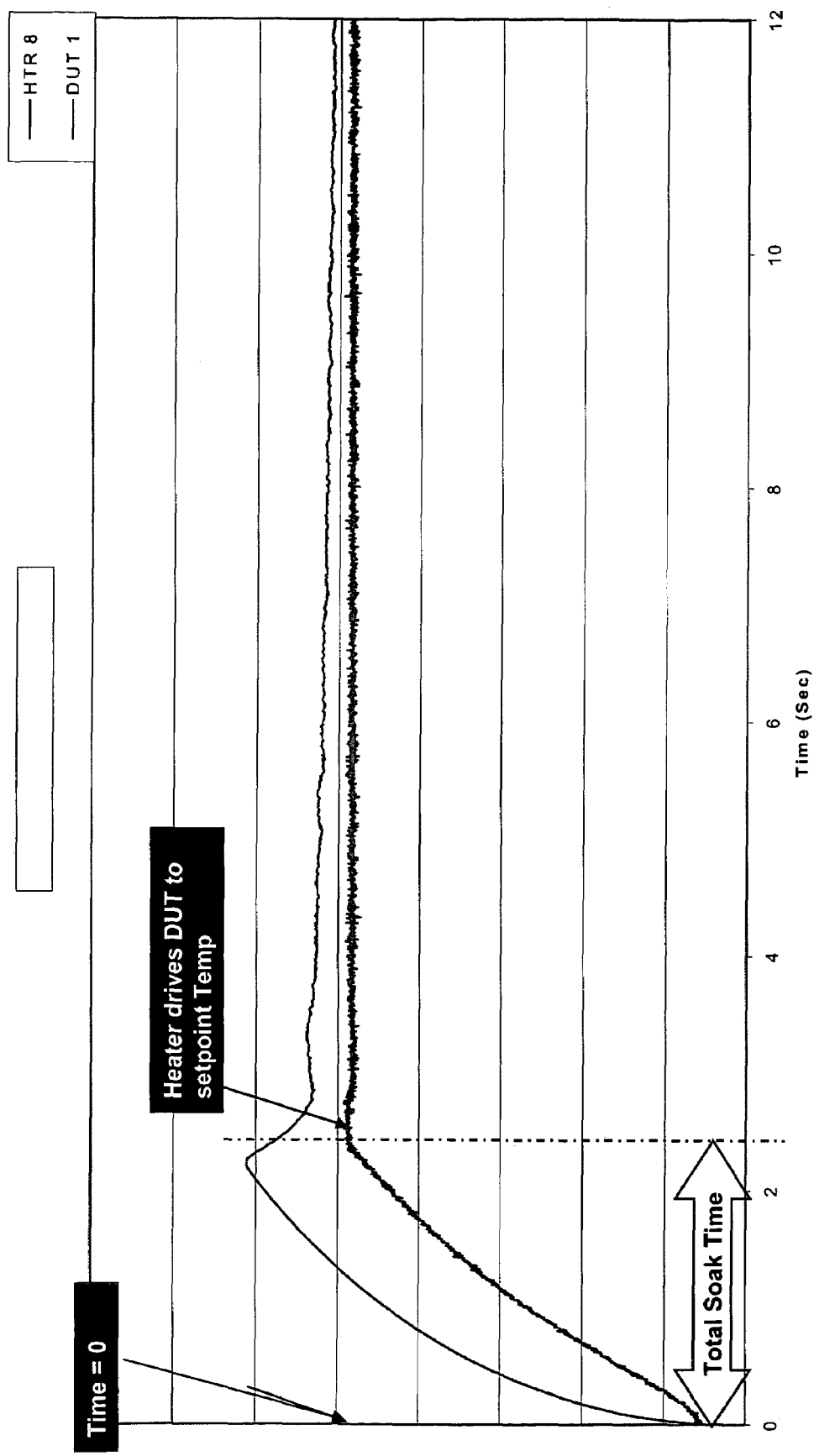
FIG. 2 is a graph illustrating a direct temperature feedback soaking method.

According to one embodiment of the invention, the direct temperature feedback (DTF) method described above and shown in FIG. 2 is first used to soak a statistically relevant sample of devices. The control temperatures vs. time for the heater 15 are recorded for each device tested. Then, the obtained control information is averaged to create a normalized predefined profile or soak profiling script. The profiling script can be used by the automated testing handler 10 to establish a series of heater 15 set points that approximate the heater 15 behavior of a heater 15 used in the DTF soak method. Thus, the automated testing handler 10 can use the soak profiling script to soak DUTs 13 by simulating the DTF method. However, there are several drawbacks to this approach. First, due to the scarcity of calibrated devices, it is difficult to acquire and calibrate a statistically relevant sample of devices. In addition, the above-described method requires multiple soak profiling scripts to be created, distributed and stored for use in multiple automated testing handlers 10. Third, the above-described method requires automated handler control software to read and process the soak profiling scripts so that the automated testing handler 10 adjusts the heater 15 set points in real time. This process can become computationally expensive when a number of DUTs asynchronously undergo soaking.

According to another embodiment of the invention, a series of linear approximations of the heater 15 response curve defined in the DTF method is created. For a given DTF soak method, as described above, the linear ramp rates for the heater 15 are determined and recorded as a control recipe for an automated testing handler 10. A linear approximation of the heater 15 response curve results in a more accurate control recipe. One advantage of this method is that it does not require having to read and replay stored files. However, such an approximation also requires a significant characterization effort and increasingly complex control software.

Figure 4:
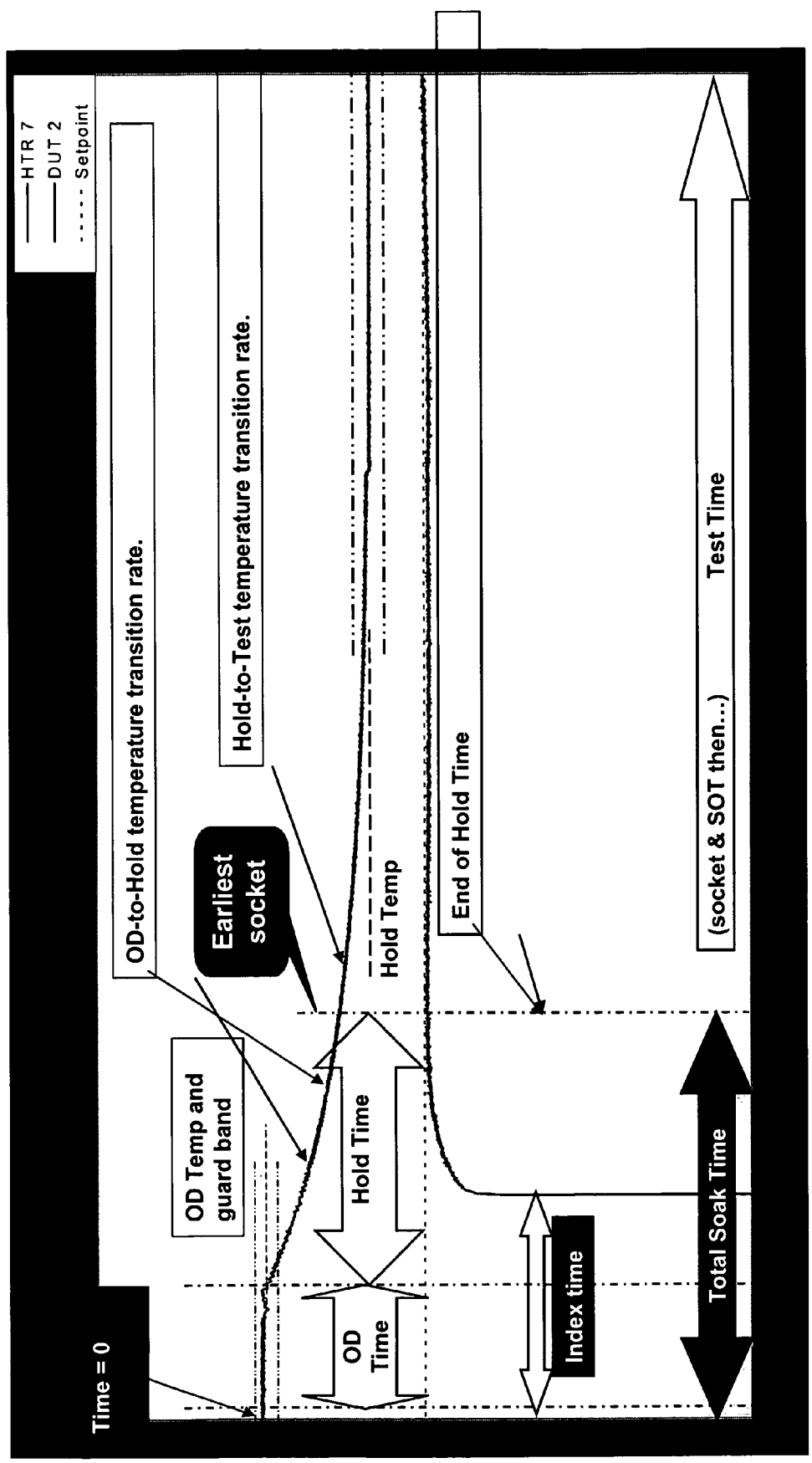
FIG. 4 is a graph illustrating a method for soaking a device according to one embodiment of the invention.
Figure 6:
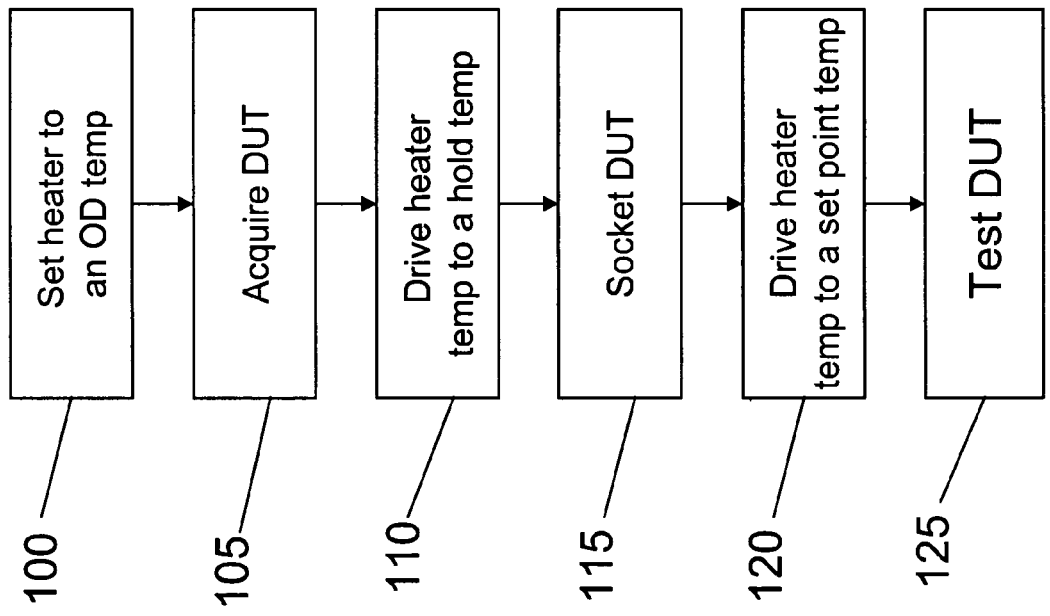
FIG. 6 is a flowchart illustrating a method for soaking a device according to one embodiment of the invention.

According to another embodiment of the invention, a method for soak profiling is shown in FIGS. 4 and 6. FIG. 4 illustrates time vs. temperature readings for a soak profiling method for an "In-socket soak." The time, in seconds, is displayed on the X axis in two (2) second increments. The temperature of a heater 15 for heating the socketed DUT 13 and the temperature of the socketed DUT 13 is represented along the Y axis. According to one embodiment of the invention, the heater 15 is set at an overdrive temperature within a guard band region before a DUT 13 is picked up by the pick and place handler 14 (Step 100). As shown in FIG. 4, at time=0 seconds, a DUT 13 is picked up from the carrier 12 by the pick and place handler 14 (Step 105). At this stage, the DUT 13 is exposed to the heat generated by the heater 15. The period of time after the DUT 13 is picked up in which the heater 15 maintains the overdrive temperature within a guard band temperature is referred to as the overdrive time.

As shown in FIG. 4, the heater 15 temperature from the time the DUT 13 is picked up by the pick and place handler 14 until the end of the overdrive time period can be represented by the equation:

$$T\_htr(n) = \text{Soak\_Overdrive\_temperature}$$

At the end of a predetermined amount of time (the end of the overdrive time period), the temperature of the heater 15 is driven to a hold time temperature (Step 110). The hold temperature is implemented to allow the automated testing handler 10 to hold the DUT 13 at an offset temperature relative to the set point temperature so that when the DUT 13 is socketed, the DUT 13 temperature settles into the set point temperature and is relatively unaffected by heat fluctuations due to the contactor 16. According to one embodiment of the invention, the heater 15 transitions to a hold time temperature at about 1 second after time=0 seconds. A controlled heater 15 temperature profile is used by the automated testing handler 10 to change the heater 15 temperature from an overdrive temperature to a hold temperature. The transition rate of the heater 15 temperature from the overdrive temperature to the hold temperature is derived from a natural decay rate.

According to one embodiment of the invention, the decay rate for the transition from overdrive temperature to hold temperature is based on the first-order thermal response of the DUT 13 when suspended in free air. The decay rate is derived from a formula which describes the temperature response of a DUT 13 as a function of its thermal time constant. The formula can be stated as follows:

$$T\_dut\_1 = T\_dut\_0 + (T\_htr\_1 - T\_htr\_0) \times (1 - e^{-(1/Up\_date\_Rate/Tau\_dut)})$$

The formula above represents a typical time vs. temperature curve of a device immediately after a step change in temperature by an automated testing system. The variable "Update_Rate" is the frequency at which a control system updates its output, and is expressed in Hertz (Hz). For example, if a control system updates its control output 250 times per second, its update rate is 250 Hz. The variable "Tau_DUT" refers to the thermal time constant of the DUT 13, and is a physical constant defined by the shape, density, thermal conductivity, and specific heat of the materials from which the DUT 13 is constructed.

Thus, during the hold time as illustrated in FIG. 4, the heater 15 temperature can be represented by the equation:

$$T\_htr(n) = T\_htr(n-1) - [T\_htr(n-1) - T\_hold] \times (1 - e^{-Time\_step/Tau\_hold})$$

The variable "Time_Step" is the inverse of the variable "Update_Rate", also known as the time from one update to the next sequential update. For example, a control system with an update rate of 250 Hz will have a time step of 4 milliseconds between updates. The variable "Tau_Hold" refers to the thermal time constant that is desired when changing from an Overdrive Temperature to a Hold Temperature. Tau_Hold controls the exponential rate of change of the automated testing system's temperature during the transition from Overdrive to Hold. Tau_Hold will not be equal to the device's physical time constant, and will also not be equal to the automated testing system's physical time constant. Tau_Hold will be somewhere in between the device's physical time constant and the automated testing system's physical time constant, and is derived experimentally.

As shown in FIG. 4, after a certain amount of time denoted "index time" the temperature of the DUT 13 rises due to the heater 15 temperature and is driven toward a test set point temperature. This rise in temperature generally occurs during the hold time of the heater 14.

At the end of the hold time the DUT 13 can be socketed in preparation for the start of tests on the DUT 13 (Step 115). According to one embodiment of the invention, the earliest a DUT 13 can be socketed is at the end of the hold time. At this point, if needed, the automated testing handler controls the heater 15 temperature to drive the temperature of the heater 15 from the hold temperature guard band to the set point temperature guard ban (Step 120). The heater 15 temperature during this phase of the procedure is based on the second-order thermal response of the DUT 13 losing heat to the contactor 16 and can be represented by the equation:

$$T\_htr(n) = T\_htr(n-1) - [T\_htr(n-1) - T\_hold] \times (1 - e^{-Time\_step/Tau\_hold}) - [T\_htr(n-1) - T\_stpt] \times (1 - e^{-Time\_step/Tau\_stpt})$$

The variable "Tau_stpt" refers to the thermal time constant that is desired when changing from a Hold Temperature to the Set point Temperature. Tau_stpt controls the exponential rate of change of the automated testing system's temperature during the transition from Hold to Set point. Tau_stpt will not be equal to the device's 13 physical time constant, and will also not be equal to the temperature forcing system's physical time constant. Tau_stpt will also not be equal to the variable Tau_Hold, because the device 13 will lose heat to the contactor when it is socketed during the transition to set point. Consequently, the temperature of the socket and the number of pins connecting the device 13 to the socket will influence the necessary rate of change. Tau_stpt is also derived experimentally.

The heater 15 temperature continues to transition until a set point temperature is reached. However, as shown in FIG. 4, testing of the DUT 13 may begin before the heater 15 has reached a set point temperature if the temperature of the DUT 13 is equal to its set point test temperature (Step 125).

According to one embodiment of the invention, some devices are not significantly affected by a second-order thermal response. For these devices the second decay rate is set to zero (0). In addition, because the decay rates are cumulative applying the second decay rate may be unnecessary for automated testing handlers with contactor 16 guard heating. Contactor 16 guard heating is used to keep the contactor 16 at or near the set point temperature. For example, the temperature vs. time graph shown in FIG. 4 does not make use of a second decay rate. In contrast, the temperature vs. time graph shown in FIG. 5 shows a DUT 13 response when the second decay rate is needed.

Figure 5:
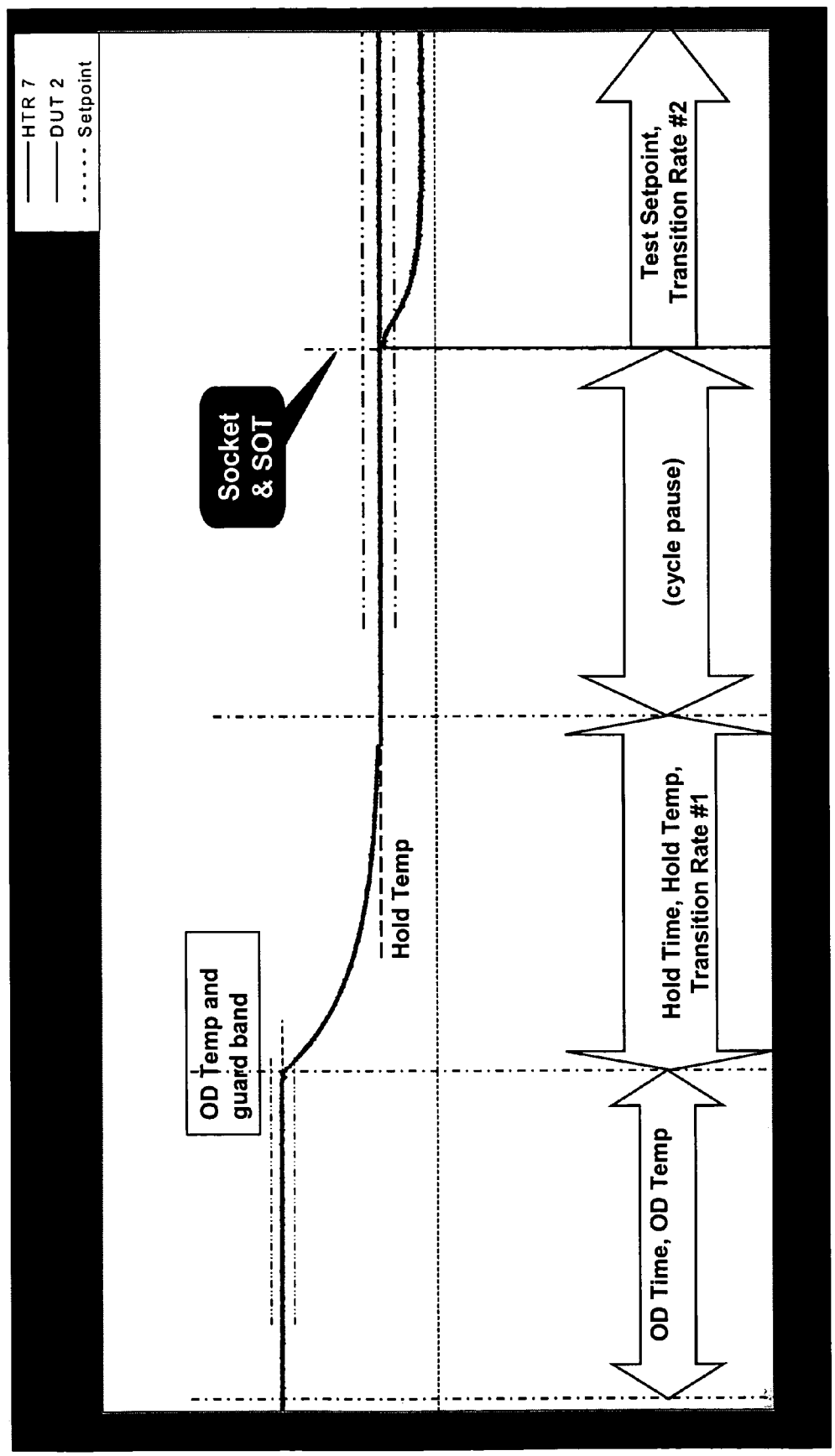
FIG. 5 is a graph illustrating a method for soaking a device according to one embodiment of the invention.

FIGS. 5 and 6 illustrate soak profiling for an out-of-socket soak. An out-of-socket soak is a method in the handler where the automatic testing system will wait for the full soak time (Overdrive+Hold) to expire prior to socketing a DUT 13 into a contactor. This is done because socketing devices 13 prior to fully soaking can lead to inconsistent temperatures at the start of test (which is not desirable). The time, in seconds, is displayed on the X axis in two (5) second increments. The temperature of a heater 15 for heating the DUT 13 and the temperature of the DUT 13 is represented along the Y axis. According to one embodiment of the invention, and as shown in FIG. 5 from time=0 to about time=15 seconds, the heater 15 is set to a predetermined overdrive temperature (Step 100). Generally, overdrive temperature varies, but could be as much as 15° C. greater than a set point temperature. As shown in FIG. 6, at time=0 seconds, a DUT 13 is picked up by the pick and place handler 14 from the carrier 12 (Step 105). The period of time after the DUT 13 is picked up in which the heater 15 achieves and maintains the overdrive temperature within a guard band temperature is referred to as the overdrive time.

As shown in FIG. 5, the heater 15 temperature during this time period can be represented by the equation:

$$T\_htr(n) = \text{Soak\_Overdrive\_temperature}$$

At the end of a predetermined amount of time, the temperature of the heater 15 transitions to a hold time temperature (Step 110). According to one embodiment of the invention, the heater 15 transitions to a hold time temperature at about 1 second after time=15 seconds.

A heater 15 temperature profile is used by the automated testing handler 10 to modify the heater 15 temperature from an overdrive temperature to a hold temperature. As described above, during the hold time, where the heater 15 transitions from a overdrive temperature to a hold temperature, the heater 15 temperature can be represented by the equation:

$$T\_htr(n) = T\_htr(n-1) - [T\_htr(n-1) - T\_hold] \times (1 - e^{-Time\_step/Tau\_hold}) - [T\_htr(n-1) - T\_stpt] \times (1 - e^{-Time_{13}step/Tau\_stpt})$$

The hold temperature may vary but is generally equal to the set point temperature. Once the heater 15 temperature has obtained a hold temperature within the hold temperature guard band a cycle pause occurs. The pause time is usually the result of the operator stopping the machine for some reason not related to temperature control. For example, clearing a jammed component, loading more parts into the handler, inspecting a sensor inside the machine, etc. The soak process has to take into account unpredictable events like this. At the end of the cycle pause, the DUT 13 can be socketed (115) in preparation for the start of tests on the DUT 13 (Step 120). As show in FIG. 5, the temperature of the DUT 13 is initially equal to that of the heater 15 hold temperature. Subsequently, heat loss occurs through the contactor 16 due to socketing. Accordingly, the heater 15 is driven to a new offset temperature at the time the DUT 13 is socketed to account for heat loss (Step 125).

According to one embodiment of the invention, a second decay rate is used to control the heater 15 temperature as it is driven to a new offset temperature at the time the DUT 13 is socketed to account for heat loss. The second decay rate is based on the second-order thermal response of the DUT 13 losing heat to the contactor.

The heater 15 temperature during this phase of the procedure can be represented by the equation:

$$T\_htr(n) = T\_htr(n-1) - [T\_htr(n-1) - T\_hold] \times (1 - e^{-Time\_step/Tau\_hold}) - [T\_htr(n-1) - T\_stpt] \times (1 - {}^{-Time\_step/Tau\_stpt})$$

The heater 15 temperature continues to transition until a set point temperature is reached. According to one embodiment of the invention, the temperature of the contactor 16 can have a tendency to change temperature from the beginning of a production lot until some number of DUTs 13 into the lot. Accordingly, the heater 15 of automated testing handler 10 is driven from a set point temperature to a modified set point temperature to offset the ambient contactor 16 temperature using a third natural decay rate. The third decay rate depends primarily on how the automated testing handler is operated. The third decay rate refers to the thermal mass of the contactor itself. As the hot device 13 is held in the contactor during test, the contactor temperature will rise, which will affect the heat loss from the device to ambient. Therefore, an exponent is included to help offset the rate of change of the contactor temperature.

According to the embodiments described above, several advantages are realized. The soak time for semiconductor devices is reduced. In addition, a method for approximating the temperature profile of a soak process is used without temperature sensors directly connected to the IC device. Further the method described above can be applied to any controllable hot plate and/or potential chamber designs.

The foregoing description of a preferred embodiment of the invention has been presented for purposes of illustration and description. It is not intended to be exhaustive or to limit the invention to the precise form disclosed, and modifications and variations are possible in light of the above teaching or may be acquired from practice of the invention. The embodiment was chosen and described in order to explain the principles of the invention and as a practical application to enable one skilled in the art to utilize the invention in various embodiments and with various modification are suited to the particular use contemplated. It is intended that the scope of the invention be defined by the claims appended hereto and their equivalents.

What is claimed is:

1. A method for soaking a device in an automated testing system, comprising the steps of:
    setting a temperature control device to a first temperature;
    exposing the device to the temperature control device;
    driving the temperature control device to a second temperature, wherein a temperature transition rate to the second temperature is derived from a first natural decay rate; and
    socketing the device in preparation for testing the device.

2. A method for soaking a device in an automated testing system, as claimed in claim 1, wherein the temperature control device is a heater.

3. A method for soaking a device in an automated testing system, as claimed in claim 1, wherein the first natural decay rate is based on a first-order thermal response of the device when the device is suspended in free air.

4. A method for soaking a device in an automated testing system, as claimed in claim 1, wherein the second temperature of the temperature control device is relative to a set point temperature so that when the device is socketed the temperature of the device settles at the set point temperature.

5. A method for soaking a device in an automated testing system, as claimed in claim 1, further comprising the step of:
    driving the temperature control device to a third temperature, wherein a temperature transition rate to the third temperature is derived from a second natural decay rate.

6. A method for soaking a device in an automated testing system, as claimed in claim 5, wherein the second natural decay rate is based on a second-order thermal response of the device losing heat to a contactor.

7. A method for soaking a device in an automated testing system, as claimed in claim 5, further comprising the step of:
    driving the temperature control device to a fourth temperature, wherein a temperature transition rate to the fourth temperature is derived from a third natural decay rate.

8. An automated testing system for soaking a device, comprising:
    a carrier for housing one or more devices to be tested;
    a contactor for connecting the devices to a testing apparatus;
    a pick and place handler for transporting the devices in the automated testing handler;
    a temperature control device connected to the pick and place handler for modifying the temperature of the devices; and a controller for driving the temperature of the temperature control device, wherein a temperature transition rate of the driven temperature control device is derived from a first natural decay rate, wherein the first natural decay rate is based on a first-order thermal response of the device when the device is suspended in free air.

9. An automated testing system for soaking a device, as claimed in claim 8, wherein the temperature control device is a heater.

10. An automated testing system for soaking a device, as claimed in claim 8, wherein the controller is configured to drive the temperature of the temperature control device to a hold temperature relative to a set point temperature so that when the device is connected to the contactor the temperature of the device settles at the set point temperature.

11. An automated testing system for soaking a device, as claimed in claim 8, wherein the controller is configured to drive the temperature control device to a set point temperature, wherein a temperature transition rate to the set point temperature is derived from a second natural decay rate.

12. An automated testing system for soaking a device, as claimed in claim 11, wherein the second natural decay rate is based on a second-order thermal response of the device losing heat to a contactor.

13. An automated testing system for soaking a device, as claimed in claim 11, wherein the controller is configured to drive the temperature control device to a modified set point temperature, wherein a temperature transition rate to the modified set point temperature is derived from a third natural decay rate.

* * * * *